United States Patent

Sekiya

(10) Patent No.: US 10,056,246 B2
(45) Date of Patent: Aug. 21, 2018

(54) SEMICONDUCTOR WAFER

(75) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 2302 days.

(21) Appl. No.: 11/650,502

(22) Filed: Jan. 8, 2007

(65) Prior Publication Data

US 2007/0166146 A1   Jul. 19, 2007

(30) Foreign Application Priority Data

Jan. 13, 2006   (JP) .................................. 2006-006413

(51) Int. Cl.
*H01L 21/02* (2006.01)
*H01L 23/544* (2006.01)

(52) U.S. Cl.
CPC ...... *H01L 21/02021* (2013.01); *H01L 23/544* (2013.01); *H01L 2223/54493* (2013.01)

(58) Field of Classification Search
CPC ......... H01L 2223/54493; H01L 23/544; H01L 21/02021
USPC ..................... 428/64.1, 66.7; 117/902, 922
See application file for complete search history.

(56) References Cited

U.S. PATENT DOCUMENTS

| | | | | |
|---|---|---|---|---|
| 4,783,225 A | * | 11/1988 | Maejima et al. | 428/66.7 |
| 5,763,290 A | * | 6/1998 | Nakajima | 438/33 |
| 6,268,641 B1 | * | 7/2001 | Yano et al. | 257/620 |
| 2002/0153620 A1 | * | 10/2002 | Guldi et al. | 257/797 |
| 2003/0015806 A1 | * | 1/2003 | Chiba et al. | 257/797 |
| 2005/0098095 A1 | * | 5/2005 | D'Evelyn et al. | 117/105 |
| 2006/0131696 A1 | * | 6/2006 | Arikado | H01L 23/544 |
| | | | | 257/618 |
| 2006/0194520 A1 | * | 8/2006 | Nakayama et al. | 451/42 |

FOREIGN PATENT DOCUMENTS

| | | |
|---|---|---|
| JP | H2-76226 | 3/1990 |
| JP | H6-53100 | 2/1994 |
| JP | H9-70740 | 3/1997 |
| JP | H10-247613 | 9/1998 |
| JP | 2001-267193 | 9/2001 |
| JP | 2003-332271 | 11/2003 |
| JP | 2004-281551 | 10/2004 |
| JP | 2005-123425 | 5/2005 |

* cited by examiner

*Primary Examiner* — Matthew Song
(74) *Attorney, Agent, or Firm* — Smith, Gambrell & Russell, LLP.

(57) ABSTRACT

A semiconductor wafer which is disk-shaped as a whole, and which has a substantially flat face, a back substantially flat in at least a main portion thereof and substantially parallel to the face, and a side surface. The side surface is convex as a whole in a longitudinal sectional view. A means to be detected, which is composed of a local flat surface, is disposed in the side surface.

3 Claims, 2 Drawing Sheets

SEMICONDUCTOR WAFER

FIELD OF THE INVENTION

This invention relates to a semiconductor wafer having, disposed therein, a means to be detected which is disposed in relation to characteristics such as crystal orientation.

DESCRIPTION OF THE PRIOR ART

In the production of a semiconductor device, as is well known, the face of a generally disk-shaped semiconductor wafer is partitioned into many rectangular regions by streets arranged in a lattice pattern. A semiconductor circuit is formed in each of the rectangular regions, and the semiconductor wafer is divided along the streets to separate the rectangular regions individually. The resulting individual rectangular regions are used for the formation of semiconductor devices. If the semiconductor wafer is a silicon wafer, for example, the semiconductor wafer has crystal orientation, and it is important for each of the rectangular regions (accordingly, each of the streets) to be arranged in a predetermined manner with respect to the crystal orientation. Thus, a means to be detected, which can be detected mechanically or optically, is disposed in the semiconductor wafer in relation to the crystal orientation. Examples of such a means to be detected are a straight edge, called an orientation flat, which is formed by cutting a peripheral edge portion of the semiconductor wafer along a chord, and a notch formed by notching a peripheral edge portion of the semiconductor wafer into a triangular shape (see, for example, Japanese Unexamined Patent Publication No. 2001-267193).

However, a conventional means to be detected, which is disposed in the semiconductor wafer, poses the following problems to be solved: (1) Owing to the formation of the means to be detected, a local defect is created in the face of the semiconductor wafer, thus leading to a decrease in an effective area for partitioning off the rectangular regions for formation of semiconductor circuits. (2) Because of the formation of the means to be detected, a sharp angle or a notch is produced, thus resulting in a marked decrease in the strength of the semiconductor wafer. The decrease in the effective area means a decrease in the efficiency of utilization of the material, thereby impeding the reduction of the manufacturing cost of the semiconductor device. In recent times, it has been often demanded that the thickness of the semiconductor wafer be decreased to a value of the order of several tens of micrometers. If the thickness of the semiconductor wafer is markedly decreased, in particular, a decrease in the strength of the semiconductor wafer poses a serious problem.

SUMMARY OF THE INVENTION

An object of the present invention is, therefore, to provide a novel and improved semiconductor wafer having a means to be detected, which can be detected sufficiently easily, but does not cause a local defect to the face of the semiconductor wafer, and does not markedly decrease the strength of the semiconductor wafer.

According to the present invention, there is provided, as a semiconductor wafer for attaining the above object, a semiconductor wafer which is disk-shaped as a whole, and which has a substantially flat face, a back substantially flat in at least a main portion thereof and substantially parallel to the face, and a side surface, the side surface being convex as a whole in a longitudinal sectional view, wherein a means to be detected, which is composed of a local flat surface, is disposed in the side surface.

Preferably, the flat surface extends substantially perpendicularly to the face. It is preferred that the side surface is nearly semicircular in a longitudinal sectional view, and the flat surface is nearly elliptical in a front view. The means to be detected can be disposed in relation to the crystal orientation of the semiconductor wafer.

DETAILED DESCRIPTION OF THE PREFERRED EMBODIMENTS

The preferred embodiments of a semiconductor wafer constituted in accordance with the present invention will now be described in further detail with reference to the accompanying drawings.

Figure 1:
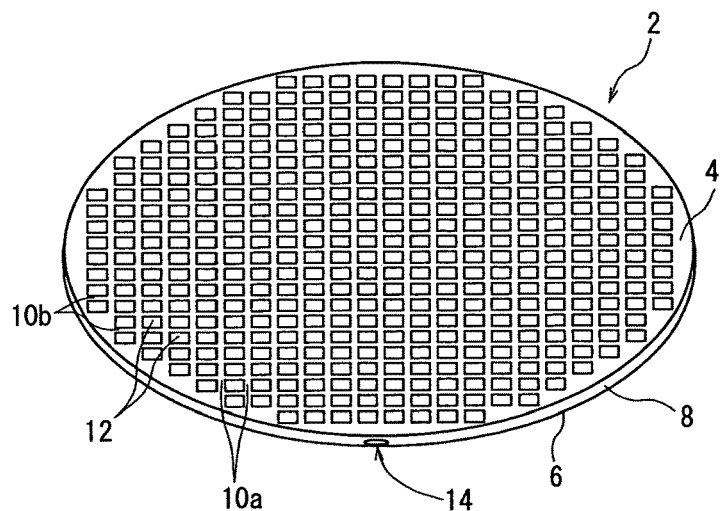
FIG. 1 is a perspective view showing a preferred embodiment of a semiconductor wafer constituted in accordance with the present invention.
Figure 2:
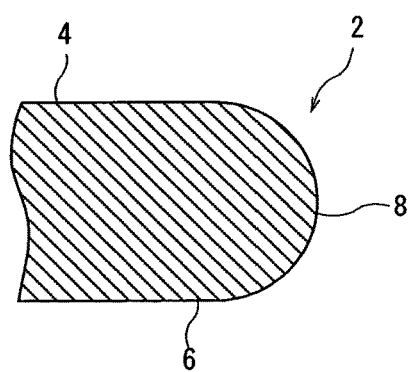
FIG. 2 is a partial longitudinal sectional view of the wafer shown in FIG. 1.

FIG. 1 shows a semiconductor wafer 2, such as a silicon wafer, constituted in accordance with the present invention. The wafer 2 is disk-shaped as a whole, and has a substantially flat circular face 4, a similarly substantially flat circular back 6, and a side surface 8. As will be understood by reference to FIG. 2, a longitudinal sectional view, together with FIG. 1, the face 4 and the back 6 extend parallel. It is important that the side surface 8 be convex as a whole in a longitudinal sectional view. In the embodiment illustrated in FIGS. 1 and 2, the side surface 8 is nearly semicircular, and an upper half of the side surface 8 is inclined radially outwardly toward below, while a lower half of the side surface 8 is inclined radially inwardly toward below.

On the face 4 of the wafer 2, many streets 10a and 10b are arranged in a lattice pattern to define many rectangular regions 12. A suitable semiconductor circuit can be formed in each of the rectangular regions 12.

Figure 3:
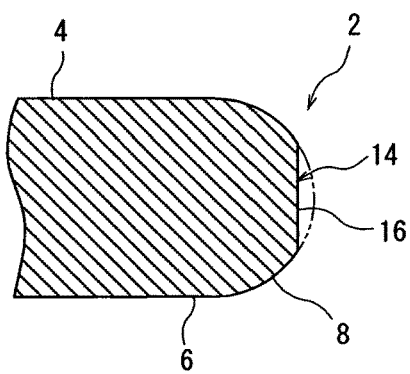
FIG. 3 is a partial longitudinal sectional view of a portion, where a flat surface constituting a means to be detected is formed, in the wafer shown in FIG. 1.
Figure 4:
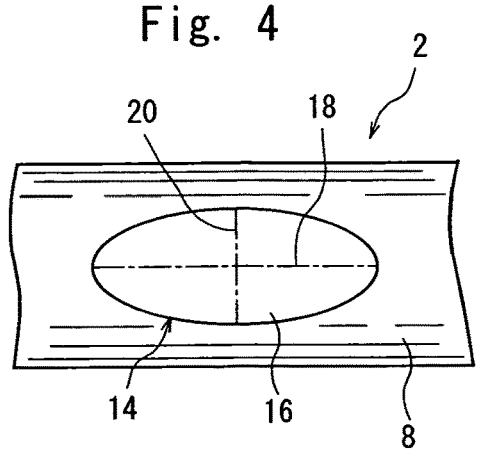
FIG. 4 is a front view showing the flat surface constituting the means to be detected, in the wafer shown in FIG. 1.

With reference to FIGS. 3 and 4 along with FIG. 1, a means 14 to be detected is formed in the side surface 8 of the wafer 2. The means 14 to be detected is composed of a local flat surface 16 (flat in the axial direction of the wafer and the circumferential direction of the side surface 8 of wafer 2) which can be formed by cutting the side surface. If desired, the flat surface 16 can be inclined with respect to the face 4 and the back 6, but preferably, extends substantially perpendicularly to the face 4 and the back 6, as shown in FIG. 3. In the illustrated embodiment, the side surface 8 is nearly semicircular in FIG. 2, which is the longitudinal sectional view, as stated above. Thus, the flat surface 16 is elliptical in FIG. 4 which is a front view. The major axis 18 of the flat surface 16 of an elliptical shape extends in a circumferential direction, and the minor axis 20 of the flat surface 16 extends in a thickness direction, namely, a central axis (axial) direction. Preferably, the upper end of the minor axis 20 is located somewhat below the boundary between the face 4 and the side surface 8, while the lower end of the minor axis 20 is located somewhat above the boundary between the back 6 and side surface 8. The flat surface 16 constituting the means 14 to be detected is placed in a predetermined relation with the crystal orientation of the wafer 2.

The above-described wafer 2 can be formed, for example, in the following manner: First, a cylindrical silicon ingot is produced. Then, cutting is applied to a particular angular region in a side surface of this ingot to form a flat surface extending along the central axis of the ingot. Then, the ingot is cut in a direction perpendicular to its central axis to form many disks. Then, the side surface of each of the disks is cut or ground to make the shape of the side surface into a nearly semicircular shape in a longitudinal sectional view. By so doing, the above flat surface formed in the ingot becomes a flat surface, which has an elliptical shape in a front view, in the side surface of each disk.

In the wafer 2 constituted in accordance with the present invention, no defect is caused to the face 4 by the formation of the flat surface 16 constituting the means 14 to be detected. Thus, substantially all of the face 4 can be effectively used to define the rectangular regions 12 forming the semiconductor circuits. Moreover, the formation of the flat surface 16 constituting the means 14 to be detected does not result in the production of a notch or a sharp angle. Hence, even if the strength of the wafer 2 is decreased owing to the presence of the means 14 to be detected, the decrease is slight. The means 14 to be detected, which has been constituted from the flat surface 16 extending perpendicularly to the face 4, can be detected sufficiently easily by throwing light toward the side surface 8 of the wafer 2, and detecting reflected light reflected by the flat surface 16.

Figure 5:
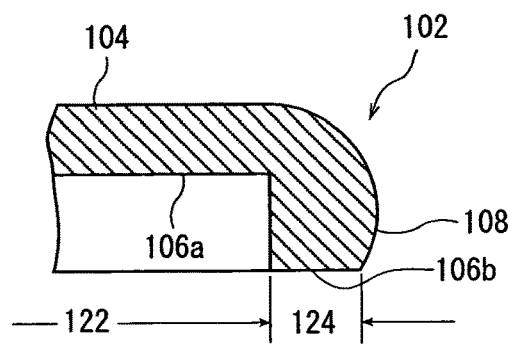
FIG. 5 is a partial longitudinal sectional view showing a modified embodiment of a semiconductor wafer constituted in accordance with the present invention.
Figure 6:
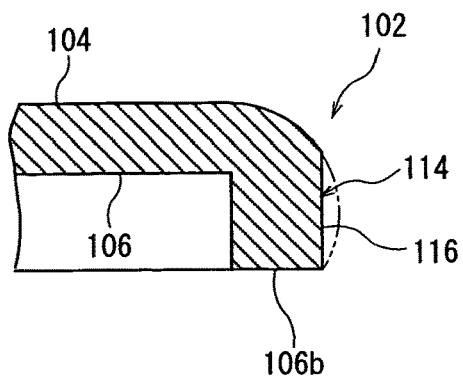
FIG. 6 is a partial longitudinal sectional view of a portion, where a flat surface constituting a means to be detected is formed, in the wafer shown in FIG. 5.

FIGS. 5 and 6 show a modification of a semiconductor wafer constituted in accordance with the present invention. In a wafer 102 shown in FIGS. 5 and 6, a central main portion 122 is rendered noticeably thin, while an annular peripheral edge region 124 is rendered relatively thick. In further detail, the face 104 of the wafer 102 is of an overall flat circular shape, while the back of the wafer 102 is composed of a flat circular back 106a located in the central main portion 122 and a flat annular back 106b located in the annular peripheral edge region 124. As disclosed, for example, in Japanese Unexamined Patent Publication No. 2004-281551 and Japanese Unexamined Patent Publication No. 2005-123425, if the thickness of a wafer is rendered small overall, the strength of the wafer is markedly decreased. If the circular central portion of the wafer is thinned, but the annular peripheral edge region is relatively thickened, on the other hand, the decrease in the strength of the wafer can be restricted to a considerably small range. Furthermore, in the modification illustrated in FIGS. 5 and 6, the side surface of the wafer 102 is not of a nearly semicircular shape in FIG. 5, as a longitudinal sectional view, but is of an arcuate shape extending in a nearly 110-degree angular region. Besides, the outer diameter of the annular back 106b is somewhat larger than the outer diameter of the circular face 104. A flat surface 116 constituting a means 114 to be detected is formed in a side surface 108. The flat surface 116 extends perpendicularly to the face 104 and the back 106, but in a front view, is not of a regular elliptical shape, but is of a modified elliptical shape. The features of the wafer 102 shown in FIGS. 5 and 6, which have been described above, are substantially the same as those of the wafer 2 shown in FIGS. 1 to 4.

While the two preferred embodiments of the semiconductor wafer constituted according to the present invention have been described in detail by reference to the accompanying drawings, it is to be understood that the present invention is not limited to such embodiments, but various changes and modifications may be made without departing from the scope of the invention.

What I claim is:

1. A semiconductor wafer which is disk-shaped as a whole, said wafer consisting essentially of:
   a substantially circular flat face having a center, a circumferential edge, and a radius therebetween,
   a substantially circular back that is substantially flat in at least a main portion thereof and substantially parallel to the face,
   a side surface that connects the flat face and the back, the side surface being convex as a whole in a longitudinal sectional view so as to extend radially outwardly from the flat face and the back, and
   a means to be detected, which is composed of one local surface that is disposed in the side surface, in relation to a crystal orientation of the semiconductor wafer, the local surface being flat in an axial direction of the wafer and in the circumferential direction of the circumferential edge of the wafer, and having an uppermost portion and a lowermost portion,
   wherein the local surface is in the side surface at a location radially outside of said radius with its uppermost portion below said circumferential edge which defines a boundary between the flat face and the side surface,
   whereby the local flat surface nowhere reduces said radius of the flat face and thereby avoids creation of a defect in the flat face.

2. The semiconductor wafer according to claim 1, wherein the flat surface extends substantially perpendicularly to the face.

3. The semiconductor wafer according to claim 1, wherein the side surface is semicircular in a longitudinal sectional view, and the one local surface is elliptical in a front view.

* * * * *